(12) United States Patent
Charley et al.

(10) Patent No.: US 9,859,843 B2
(45) Date of Patent: Jan. 2, 2018

(54) DEVICE FOR CONTROLLING A CAPACITOR HAVING AN ADJUSTABLE CAPACITANCE

(71) Applicant: STMicroelectronics (Tours) SAS, Tours (FR)

(72) Inventors: Sylvain Charley, Mettray (FR); Jerome Heurtier, Tours (FR); Laurent Jeuffrault, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 15/252,868

(22) Filed: Aug. 31, 2016

(65) Prior Publication Data
US 2017/0230002 A1    Aug. 10, 2017

(30) Foreign Application Priority Data

Feb. 10, 2016    (FR) ...................... 16 51064

(51) Int. Cl.
| | |
|---|---|
| *H03B 5/20* | (2006.01) |
| *H03L 7/107* | (2006.01) |
| *H01G 7/06* | (2006.01) |
| *H03B 5/12* | (2006.01) |

(52) U.S. Cl.
CPC ............. *H03B 5/20* (2013.01); *H03L 7/1075* (2013.01); *H01G 7/06* (2013.01); *H03B 5/124* (2013.01); *H03B 2201/011* (2013.01)

(58) Field of Classification Search
CPC ........................................................ H03B 5/20
USPC .............................................. 331/36 C, 177 V
See application file for complete search history.

(56) References Cited

U.S. PATENT DOCUMENTS

| | | | |
|---|---|---|---|
| 2004/0189417 A1 | 9/2004 | Fujita | |
| 2008/0136545 A1* | 6/2008 | Fayneh | H03B 5/20 331/36 C |
| 2012/0326797 A1 | 12/2012 | Chiu et al. | |
| 2015/0048898 A1* | 2/2015 | Gaynor | H03H 7/40 333/124 |

OTHER PUBLICATIONS

INPI Search Report and Written Opinion for FR 1651064 dated Nov. 25, 2016 (9 pages).
Kavanagh, Ken: "Boost Supply and High-Voltage DAC Provide Tuning Signal for Antennas and Filters," Jan. 12, 2010, XP055137122, http://www.analog.com/library/analogdialogue/archives/44-12/tunable.pdf (4 pages).

\* cited by examiner

*Primary Examiner* — Joseph Chang
(74) *Attorney, Agent, or Firm* — Gardere Wynne Sewell LLP

(57) ABSTRACT

A first capacitor has a capacitance adjustable to a set point value by application of a bias voltage. A second capacitor also has a capacitance adjustable to a set point value by application of a bias voltage. The first and second capacitors are arranged to receive the same bias voltage generated by a control circuit. The control circuit receiving the set point value as an input and generates that bias voltage in response to a quantity representative of a capacitance of the second capacitor.

20 Claims, 1 Drawing Sheet

DEVICE FOR CONTROLLING A CAPACITOR HAVING AN ADJUSTABLE CAPACITANCE

PRIORITY CLAIM

This application claims the priority benefit of French Application for Patent No. 1651064, filed on Feb. 10, 2016, the disclosure of which is hereby incorporated by reference in its entirety to the maximum extent allowable by law.

TECHNICAL FIELD

The present disclosure generally relates to electronic circuits and, more specifically, to the control of a capacitor having a value adjustable by application of a bias voltage. The present disclosure more specifically applies to the control of BST (Barium-Strontium-Titanium) capacitors.

BACKGROUND

BST capacitors have essentially been developed for radio applications, in particular for mobile telephony. Having a capacitor with an analog-adjustable capacitance significantly improves performance, since it enables to adapt the device comprising such a capacitor to the outer environment.

A BST capacitor conventionally appears in the form of an integrated circuit comprising at least three terminals, two terminals corresponding to the capacitor electrodes, intended to be connected to the radio frequency application, and one terminal of application of a DC bias potential. The capacitance of a capacitor is set by the value of the DC bias potential which is applied thereto, generally in a range from a few volts to a few tens of volts, typically between 2 and 20 volts.

The bias voltage of a BST capacitor is generally provided by a dedicated control circuit, performing a high-voltage digital-to-analog conversion, that is, converting a digital configuration word (generally, a byte) into a DC analog voltage to be applied to the capacitor to set the capacitance thereof.

The control or configuration of a BST capacitor now suffers from inaccuracies due, among others, to manufacturing tolerances and temperature-related variations and variations related to the capacitor hysteresis.

SUMMARY

Thus, an embodiment provides a device comprising: a first capacitor having a capacitance adjustable to a set point value by application of a bias voltage; a second capacitor having a capacitance adjustable to a set point value by application of a bias voltage, the second capacitor being arranged to receive the same bias voltage as the first capacitor; and a control circuit capable of receiving said set point value and of generating said bias voltage while taking into account a quantity representative of the capacitance of the second capacitor.

According to an embodiment, the first and second capacitors are matched, to substantially have the same temperature variation.

According to an embodiment, the first and second capacitors are identical to within manufacturing dispersions.

According to an embodiment, the control circuit comprises a first circuit forming with the second capacitor an oscillator capable of generating a first frequency varying according to the capacitance of the second capacitor, and a feedback loop capable of adjusting the bias voltage to control the first frequency with a second reference frequency.

According to an embodiment, the first circuit comprises an adjustable resistor, the value of the first frequency further depending on the value of the adjustable resistor.

According to an embodiment, the value of the adjustable resistor is set according to the set point value.

According to an embodiment, the control circuit comprises a second circuit forming, with a third fixed capacitor of the device, an oscillator capable of generating the second reference frequency.

According to an embodiment, the third fixed capacitor is a metal-ceramic-metal capacitor.

According to an embodiment, the second circuit comprises a non-adjustable resistor, the value of the second frequency further depending on the value of the non-adjustable resistor.

According to an embodiment, the adjustable resistor and the non-adjustable resistor are matched to substantially have the same temperature variation.

According to an embodiment, the first and second capacitors are integrated in a first chip comprising: first and second terminals coupled to the electrodes of the first capacitor; a third terminal of application of the bias voltage; and a fourth terminal coupled to an electrode of the second capacitor.

According to an embodiment, the control circuit is integrated in a second chip different from the first chip.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
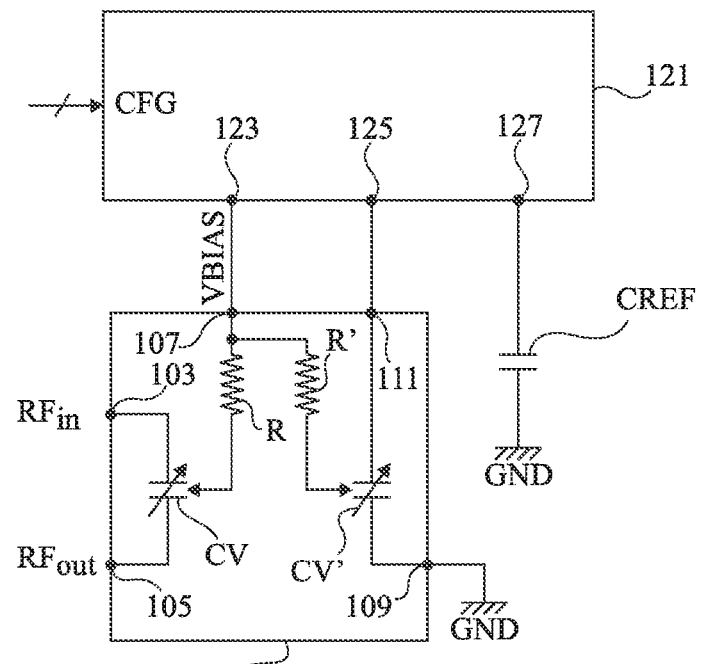
FIG. 1 is an electric diagram of an embodiment of a device comprising a capacitor of adjustable capacitance by application of a bias voltage and a circuit for controlling the capacitor.

The same elements have been designated with the same reference numerals in the different drawings. For clarity, only those elements which are useful to the understanding of the embodiments which will be described have been shown and will be detailed. In particular, the forming of a BST capacitor has not been detailed, the described embodiments being compatible with usual capacitors adjustable by application of a bias voltage (for example, BST capacitors). Further, the different possible applications of a BST capacitor have not been detailed either, the described embodiments being here again compatible with usual applications. In the following description, expressions "approximately", "about", and "in the order of" mean to within 10%, preferably to within 5%. In the present description, term "connected" is used to designate a direct electric connection, with no intermediate electronic component, for example, by means of one or a plurality of conductive tracks, and term "coupled" or term "linked" is used to designate either an electric connection which may be direct (then meaning "connected") or indirect (that is, via one or a plurality of intermediate components).

FIG. 1 is an electric diagram of an embodiment of a device comprising a capacitor having a capacitance adjustable by application of a bias voltage and a circuit for controlling the capacitor.

The device of FIG. 1 comprises an integrated circuit 101 comprising a capacitor CV having a capacitance adjustable by application of a bias voltage, for example, a BST capacitor. Integrated circuit 101 comprises two terminals 103 and 105 corresponding to the electrodes of capacitor CV, intended to be connected to the radio frequency application (RFin, RFout). Integrated circuit 101 further comprises a terminal 107 defining a terminal of application of a bias potential VBIAS setting the capacitance of capacitor CV. From an electric viewpoint, this bias potential is applied via a resistor R.

The device of FIG. 1 further comprises a second capacitor CV' having a capacitance adjustable by application of a bias voltage, integrated in the same circuit 101 as capacitor CV. Capacitors CV and CV' are matched to have substantially the same temperature variation (in percent per degree). Capacitor CV' is for example identical to capacitor CV to within manufacturing dispersions. Integrated circuit 101 comprises two terminals 109 and 111 corresponding to the electrodes of capacitor CV'. Terminal 109 is intended to be coupled to a node GND of application of a reference potential of the application, for example, the ground. Terminal 111 is intended to be coupled to a control circuit 121 which will be described hereafter. Capacitor CV' is arranged to receive the same bias potential VBIAS as capacitor CV. In the shown example, bias potential VBIAS is applied to capacitor CV' via a resistor R'. Resistor R' is selected to have substantially the same value as resistor R.

Capacitors CV and CV' being arranged in the same chip 101, their characteristic differences linked to manufacturing dispersions and/or to temperature variations are very small. Further, since capacitors CV and CV' receive at any time the same variation potential VBIAS, their characteristic differences due to hysteresis (a phenomenon by which the conversion of the set point voltage applied to a capacitor of adjustable capacitance by a bias voltage into a capacitance voltage depends on the history of use of the capacitor) are also very small. As a result, whatever the conditions of use of circuit 101, capacitor CV' or reference capacitor has at any time a capacitance matched with that of capacitor CV, for example, substantially equal to that of capacitor CV.

The device of FIG. 1 further comprises a control circuit 121 capable of receiving a set point value on an input CFG, for example, a digital input, and of generating bias potential VBIAS to be applied to terminal 107 of circuit 101 to adjust the capacitance of capacitor CV to the set point value. Circuit 121 is for example an integrated circuit separate from circuit 101. Circuit 121 comprises a terminal 123 for providing bias potential VBIAS, coupled to terminal 107 of circuit 101. Circuit 121 further comprises a terminal 125 coupled to terminal 111 of circuit 101, that is, to an electrode of reference capacitor CV' of circuit 101. Circuit 121 further comprises a terminal 127 coupled to an electrode of a reference capacitor CREF of the device, external to circuit 121. In this example, the electrode of capacitor CREF opposite to terminal 127 is grounded (node GND). Circuit 121 may comprise other terminals, not shown, particularly, power supply terminals. In practice, circuit 121 may receive two different power supply voltages, a first voltage VDD, for example, in the range from 2 to 6 volts, capable of powering circuits for converting the set point value applied to input CFG of circuit 121 into an analog voltage which is a reduced image of voltage VBIAS to be applied to terminal 107 of circuit 101, and a second voltage VHV higher than voltage VDD, for example in the range from 10 to 30 V, capable of powering an output amplification stage of circuit 121, supplying bias potential VBIAS to be applied to terminal 107 of circuit 101.

Circuit 121 is capable of generating bias potential VBIAS to be applied to terminal 107 of circuit 101 while taking into account not only the set point value applied to input CFG, but also a quantity representative of the capacitance of capacitor CV', coupled to circuit 121 by terminals 111 of circuit 101 and 125 of circuit 121. Thus, bias potential VBIAS is generated while taking into account the effective capacitance of capacitor CV', which is itself substantially identical to the capacitance of capacitor CV. This enables to accurately control capacitor CV. Further, the obtaining of a quantity representative of the capacitance of capacitor CV via terminal 111 of circuit 101 is non-invasive for the radio frequency application, and terminal 111 of circuit 101 is not connected to the radio frequency application.

More particularly, in the shown example, control circuit 121 is capable of comparing a first quantity which is a function of the capacitance of capacitor CV' and of the set point value applied to input CFG with a second quantity which is a function of the capacitance of capacitor CREF, and of controlling in a closed loop the value of potential VBIAS to minimize the difference between the two quantities.

Capacitor CREF is non-adjustable and is selected to have a temperature-stable capacitance, for example, a capacitance having a temperature variation smaller than +/−0.4% in the temperature range from −25 to +85° C. Capacitor CREF is for example a capacitor of metal-ceramic-metal type.

Figure 2:
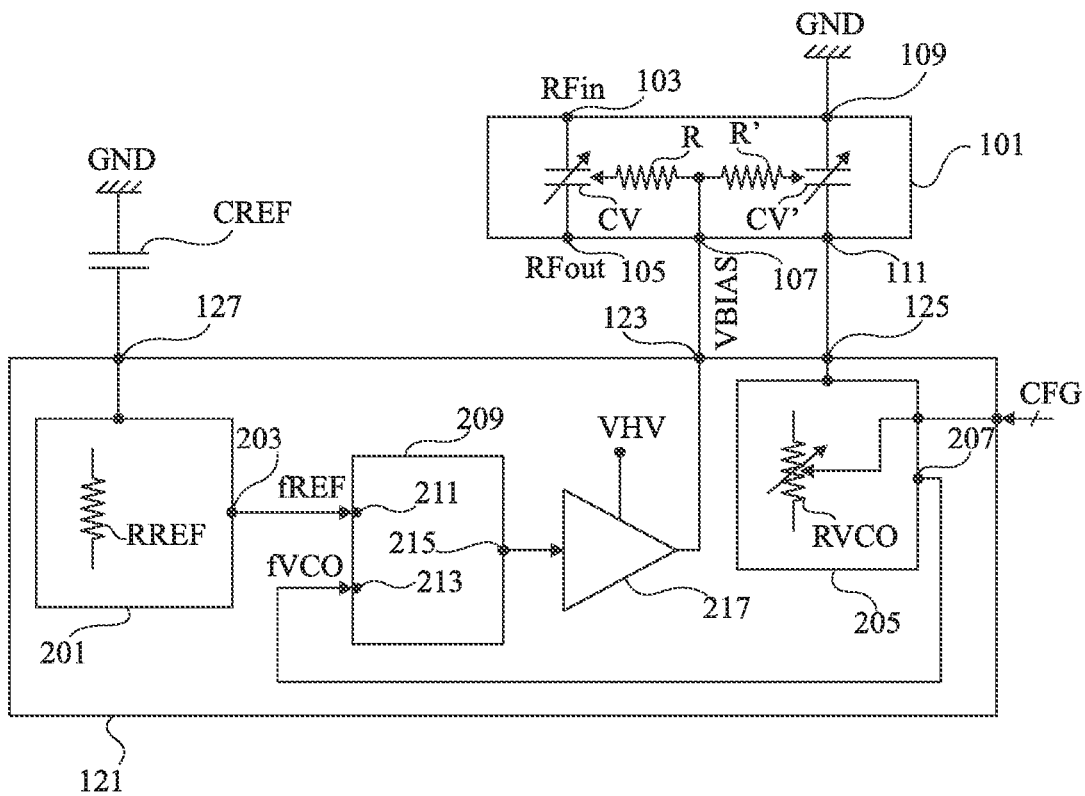
FIG. 2 is an electric diagram illustrating in further detail an embodiment of the device of FIG. 1.

FIG. 2 is an electric diagram illustrating in further detail an embodiment of the device of FIG. 1. More particularly, FIG. 2 is an electric diagram showing the elements of the diagram of FIG. 1, where an embodiment of control circuit 121 has been detailed.

In the example of FIG. 2, circuit 121 comprises a first oscillating circuit 201 coupled to terminal 127 of connection to capacitor CREF, and forming with capacitor CREF an oscillator capable of generating, on an output node 203 of circuit 201, an oscillating signal having its frequency set by product RREF*CREF, where RREF is a resistor internal to circuit 201.

Circuit 121 comprises a second oscillating circuit 205 coupled to terminal 125 of connection to capacitor CV', and forming with capacitor CV' an oscillator capable of generating, on an output node 207 of circuit 205, an oscillating signal having its frequency set by product RVCO*CV', where RVCO is a resistor internal to circuit 205.

In the shown example, resistor RREF of oscillating circuit 201 is a fixed resistor (non adjustable) and resistor RVCO of oscillating circuit 205 is an adjustable resistor. To within this difference, circuit 201 is for example identical to circuit 205. Oscillating circuits 201 (together with capacitor CREF) and 205 (together with capacitor CV') are for example RC shift oscillators. Resistors RREF and RVCO are matched, to substantially have the same temperature variation.

Circuit 121 further comprises a frequency comparison circuit 209, comprising two input nodes 211 and 213 respectively coupled to output nodes 203 and 207 of oscillating circuits 201 and 205, and one output node 215. Circuit 209 is capable of supplying on its output node 215 a DC potential having a level proportional to the frequency difference between the two input signals applied to its nodes 211 and 213.

Circuit 121 further comprises an amplifier 217 having its input coupled to output 215 of frequency comparison circuit 209, possibly via a circuit (not shown) for shaping the output signal of circuit 209. The output of amplifier 217 is coupled to terminal 123 for supplying bias potential VBIAS.

The device of FIG. 2 operates as follows. Resistor RVCO is adjusted to a predetermined value according to the set point signal applied to input CFG of circuit 121. As an example, the set point value applied to input CFG of circuit 121 is a digital value, and circuit 121 comprises a look-up table comprising, for each possible value of the digital set point signal CFG, a specific setting of resistor RVCO. Resistor RVCO for example is a digitally-adjustable resistor. Resistor RVCO for example comprises a plurality of elementary series-connected resistors, where each elementary resistor can be shorted by a switch.

Frequency fVCO of the output signal of the oscillator formed by circuit 205 and capacitor CV' is set by the product of resistance RVCO by the effective capacitance of capacitor CV'. The feedback loop comprising frequency comparator 209 and amplifier 217 acts on potential VBIAS for controlling capacitors CV and CV' to lock frequency fVCO on reference frequency fREF supplied by the oscillator formed by circuit 201 and capacitor CREF. Thus, for each value of the set point signal applied to input CFG of circuit 121, the feedback loop of circuit 121 sets the capacitance of capacitor CV' (and thus that of capacitor CV) to a value such that the output frequency of the oscillator formed by circuit 205 and capacitor CV' is substantially equal to the output frequency of the oscillator formed by circuit 201 and capacitor CREF.

An advantage of the described embodiments is that they enable to achieve an accurate control of the capacitance of capacitor CV. In particular, the described embodiments enable to significantly decrease control inaccuracies linked to the hysteresis of the dielectric material of the capacitor. It can now be envisaged to achieve accuracies in the order of one percent. Such an accuracy is particularly compatible with the forming of radio frequency filters frequency adjustable via one or a plurality of capacitors of adjustable capacitance, capable of being used in multiple-standard mobile telephone terminals, to form multiple-band antenna matching circuits, having a much lower bulk than known circuits based on switched filters.

Specific embodiments have been described. Various alterations, modifications, and improvements will occur to those skilled in the art. In particular, the described embodiments are not limited to the specific embodiment of control circuit 121 described in relation with FIG. 2. In particular, an embodiment of control circuit 121 where a frequency fVCO varying according to the capacitance of capacitor CV' and to the set point value applied to input CFG is compared with a reference frequency fREF set by the value of the capacitance of capacitor CREF has been described hereabove. The two quantities used to compare the effective value of the capacitance of capacitor CV' with the value of the capacitance of capacitor CREF and to lock the effective value of the capacitance of capacitor CV' on the value of the capacitance of capacitor CREF may however be quantities other than frequencies. More particularly, any other quantity representative of products RREF*CREF and RVCO*CV' respectively, may be used.

Further, the described embodiments are not limited to the above-described example where a reference capacitor CREF is used to generate reference frequency fREF. As a variation, frequency fREF may be generated from a signal available in the device for other functions, for example, a signal generated by a quartz oscillator.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device, comprising:
   a first capacitor having a capacitance that is adjustable to a set point value in response to application of a bias voltage;
   a second capacitor having a capacitance that is adjustable to a set point value in response to application of a bias voltage, wherein the first and second capacitors are configured to receive a same bias voltage; and
   a control circuit having an input to receive said set point value and configured to generate said bias voltage while taking into account a quantity representative of the capacitance of the second capacitor.

2. The device of claim 1, wherein the first and second capacitors are matched to substantially have a same temperature variation.

3. The device of claim 1, wherein the first and second capacitors are identical to within manufacturing dispersions.

4. The device of claim 1, wherein the control circuit comprises:
   a first oscillator circuit coupled to the second capacitor and configured to generate a first frequency varying according to the capacitance of the second capacitor; and
   a feedback loop configured to adjust said bias voltage to control said first frequency to match a second frequency.

5. The device of claim 4, wherein the first oscillator circuit comprises an adjustable resistor, and wherein a value of the first frequency is further dependent on a value of said adjustable resistor.

6. The device of claim 5, wherein the value of said adjustable resistor is set according to said set point value.

7. The device of claim 4, wherein the control circuit further comprises a second oscillator circuit coupled to a third capacitor and configured to generate said second frequency fixed by the capacitance of the third capacitor.

8. The device of claim 7, wherein the third capacitor is a metal-ceramic-metal capacitor.

9. The device of claim 7, wherein the second oscillator circuit comprises a non-adjustable resistor, and wherein a value of the second frequency is further dependent on the value of said non-adjustable resistor.

10. The device of claim 9, wherein the first oscillator circuit comprises an adjustable resistor, and wherein a value of the first frequency is further dependent on a value of said adjustable resistor.

11. The device of claim 10, wherein said adjustable resistor and said non-adjustable resistor are matched to have substantially the same temperature variation.

12. The device of claim 1, wherein the first and second capacitors are integrated in a first integrated circuit chip comprising:
   first and second terminals coupled to electrodes of the first capacitor;
   a third terminal configured to receive said bias voltage; and
   a fourth terminal coupled to an electrode of the second capacitor.

13. The device of claim 11, wherein the control circuit is integrated in a second integrated circuit chip different from the first integrated circuit chip.

14. The device of claim 1, wherein the first and second capacitors comprise Barium-Strontium-Titanium capacitors.

15. The device of claim 1, wherein the control circuit comprises:
- a first oscillator circuit coupled to the second capacitor and configured to generate a first frequency varying according to the capacitance of the second capacitor;
- a second oscillator circuit coupled to a reference capacitor and configured to generate a second frequency fixed according to the capacitance of the reference capacitor;
- a frequency difference circuit configured to receive the first and second frequencies and generate a control signal indicative of a magnitude of a difference between the first and second frequencies;
- wherein said bias voltage is derived from said control signal.

16. The device of claim 15, wherein the control circuit further comprises an amplifier circuit configured to amplify the control signal to generate said bias voltage.

17. The device of claim 15, wherein the first oscillator circuit further comprises an adjustable resistor, and wherein a value of the first frequency is further dependent on a value of said adjustable resistor.

18. The device of claim 17, wherein the value of said adjustable resistor is set according to said set point value.

19. A device, comprising:
- a first integrated circuit chip including:
- a first capacitor having a capacitance that is adjustable to a set point value in response to application of a bias voltage; and
- a second capacitor having a capacitance that is adjustable to a set point value in response to application of a bias voltage, wherein the first and second capacitors are configured to receive a same bias voltage;
- a reference capacitor; and
- a second integrated circuit chip including:
- a first oscillator circuit coupled to the second capacitor and configured to generate a first frequency varying according to the capacitance of the second capacitor;
- a second oscillator circuit coupled to said reference capacitor and configured to generate a second frequency fixed according to the capacitance of the reference capacitor;
- a frequency difference circuit configured to receive the first and second frequencies and generate a control signal indicative of a magnitude of a difference between the first and second frequencies;
- a bias generator circuit figured to output said bias voltage in response to said control signal.

20. The device of claim 19, wherein the first and second capacitors comprise Barium-Strontium-Titanium capacitors.

\* \* \* \* \*